(12) United States Patent
Hou

(10) Patent No.: US 10,559,635 B2
(45) Date of Patent: Feb. 11, 2020

(54) PIXEL DEFINING LAYER, PRODUCTION METHOD THEREOF, AND DISPLAY SUBSTRATE

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/151,747

(22) Filed: Oct. 4, 2018

(65) Prior Publication Data

US 2019/0305058 A1 Oct. 3, 2019

(30) Foreign Application Priority Data

Mar. 27, 2018 (CN) .......................... 2018 1 0261450

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01); *H01L 2227/323* (2013.01); *H01L 2251/558* (2013.01)

(58) Field of Classification Search
CPC combination set(s) only.
See application file for complete search history.

(56) References Cited

U.S. PATENT DOCUMENTS

| 2015/0028310 | A1* | 1/2015 | Dai | ...................... | H01L 27/3246 257/40 |
| 2015/0303393 | A1* | 10/2015 | Dai | ...................... | H01L 51/0004 257/40 |
| 2016/0056218 | A1* | 2/2016 | Wang | .................. | H01L 27/3246 257/40 |
| 2016/0087003 | A1* | 3/2016 | Lee | ....................... | H01L 27/153 257/88 |
| 2016/0284776 | A1* | 9/2016 | Kim | ..................... | H01L 27/3258 |
| 2016/0358987 | A1* | 12/2016 | Hou | ........................ | H01L 51/52 |
| 2017/0125719 | A1* | 5/2017 | Noh | ..................... | H01L 27/3211 |
| 2019/0044077 | A1* | 2/2019 | Zhang | ................. | H01L 51/0096 |

* cited by examiner

*Primary Examiner* — Mamadou L Diallo
(74) *Attorney, Agent, or Firm* — Westman, Champlin & Koehler, P.A.

(57) ABSTRACT

There is provided a pixel defining layer, a production method thereof, and a display substrate. The pixel defining layer comprises a first lyophobic material layer located on a base substrate, wherein the first lyophobic material layer is repellent to solutions for forming respective layers of a light-emitting diode; the pixel defining layer defines a plurality of openings in an array arrangement; and the first lyophobic material layer has a plurality of wall surfaces facing to each of the openings, wherein at least one wall surface of the plurality of wall surfaces has a slope angle larger than 0 degree and less than 90 degrees.

16 Claims, 2 Drawing Sheets

PIXEL DEFINING LAYER, PRODUCTION METHOD THEREOF, AND DISPLAY SUBSTRATE

CROSS-REFERENCE TO RELATED APPLICATION

This application claims the benefit of priority of Chinese Application No. 201810261450.4 filed on Mar. 27, 2018, the entire contents of which are hereby incorporated by reference.

TECHNICAL FIELD

This disclosure relates to the field of display. Particularly, this disclosure relates to a pixel defining layer, a production method thereof, and a display substrate.

BACKGROUND ART

An organic light-emitting diode (simply referred to as OLED) display panel is produced by sequentially forming an anode, a hole injection layer, a hole transport layer, an organic material layer, an electron transport layer, an electron injection layer, a cathode, and the like on a base substrate. Here, the organic material layer may be produced by using an ink-jet printing technique. When an organic material layer is produced by using an ink-jet printing technique, it is necessary to form a pixel defining layer on a base substrate and then ink-jet a solution of an organic light-emitting material onto the base substrate formed with the pixel defining layer to form an organic material layer.

A process for producing an organic material layer by ink-jet printing comprises an ink-jet printing process and a film forming process. In an ink-jet printing process, an ink is printed to the interior of an opening formed by a pixel defining layer. The printing precision of an apparatus will influence whether the ink will deviate from the center of a pixel. In a film forming process, an ink is allowed to form a thin film with a uniform thickness in an opening formed by a pixel defining layer, by controlling pressure, temperature, time, and the like of solvent volatilization.

SUMMARY

In an aspect, this disclosure provides a pixel defining layer, comprising a first lyophobic material layer located on a base substrate, wherein
the first lyophobic material layer is repellent to solutions for forming respective layers of a light-emitting diode;
the pixel defining layer defines a plurality of openings in an array arrangement; and
the first lyophobic material layer has a plurality of wall surfaces facing to each of the openings, wherein at least one wall surface of the plurality of wall surfaces has a slope angle larger than 0 degree and less than 90 degrees.

According to one embodiment of this disclosure, at least one wall surface of the plurality of wall surfaces has a slope angle less than or equal to 60 degrees.

According to another embodiment of this disclosure, the first lyophobic material layer has four wall surfaces facing to each of the openings, and slope angles of the four wall surfaces are equal.

According to another embodiment of this disclosure, the plurality of wall surfaces are planar or arc-shaped.

According to another embodiment of this disclosure, a contact angle of the solutions for forming respective layers of the light-emitting diode on the first lyophobic material layer is greater than 100 degrees.

According to another embodiment of this disclosure, the pixel defining layer further comprises a lyophilic material layer, wherein
the lyophilic material layer attracts the solutions for forming respective layers of the light-emitting diode; and
the lyophilic material layer is located between the first lyophobic material layer and the base substrate.

According to another embodiment of this disclosure, the pixel defining layer further comprises a second lyophobic material layer, wherein
the second lyophobic material layer is located between the lyophilic material layer and the first lyophobic material layer; and
the second lyophobic material layer is repellent to the solutions for forming respective layers of the light-emitting diode, and a lyophobicity of the second lyophobic material layer is less than a lyophobicity of the first lyophobic material layer.

According to another embodiment of this disclosure, a contact angle of the solutions for forming respective layers of the light-emitting diode on the second lyophobic material layer is in a range from 50 to 100 degrees.

According to another embodiment of this disclosure, the first lyophobic material layer has a thickness of 0.2-0.5 µm.

According to another embodiment of this disclosure, the second lyophobic material layer has a thickness of 0.2-2.0 µm.

According to another embodiment of this disclosure, the lyophilic material layer has a thickness of 0.05-0.5 µm.

According to another embodiment of this disclosure, the pixel defining layer further comprises a third lyophobic material layer, wherein
the third lyophobic material layer is located on a side of the lyophilic material layer away from the first lyophobic material layer; and
the third lyophobic material layer is repellent to the solutions for forming respective layers of the light-emitting diode, and a lyophobicity of the third lyophobic material layer is less than or equal to a lyophobicity of the second lyophobic material layer.

According to another embodiment of this disclosure, the solutions for forming respective layers of the light-emitting diode comprise a solution comprising an organic electroluminescent material.

In another aspect, this disclosure provides a method for producing a pixel defining layer, comprising steps of:
providing a base substrate; and
forming a first lyophobic material layer on the base substrate, wherein
the first lyophobic material layer is repellent to solutions for forming respective layers of a light-emitting diode; and
the pixel defining layer defines a plurality of openings in an array arrangement; the first lyophobic material layer has a plurality of wall surfaces facing to each of the openings, wherein at least one wall surface of the plurality of wall surfaces has a slope angle larger than 0 degree and less than 90 degrees.

According to one embodiment of this disclosure, at least one wall surface of the plurality of wall surfaces has a slope angle less than or equal to 60 degrees.

According to one embodiment of this disclosure, the first lyophobic material layer has four wall surfaces facing to each of the openings, and slope angles of the four wall surfaces are equal.

According to one embodiment of this disclosure, the plurality of wall surfaces are planar or arc-shaped.

According to one embodiment of this disclosure, a contact angle of the solutions for forming respective layers of the light-emitting diode on the first lyophobic material layer is greater than 100 degrees.

According to one embodiment of this disclosure, the method further comprises: before forming the first lyophobic material layer, forming a lyophilic material layer on the base substrate, and then forming the first lyophobic material layer on the lyophilic material layer, wherein the lyophilic material layer attracts the solutions for forming respective layers of the light-emitting diode, and the lyophilic material layer is located between the first lyophobic material layer and the base substrate.

According to another embodiment of this disclosure, the method further comprises: after forming the lyophilic material layer, forming a second lyophobic material layer on the lyophilic material layer, and then forming the first lyophobic material layer on the second lyophobic material layer, wherein the second lyophobic material layer is repellent to the solutions for forming respective layers of the light-emitting diode, and a lyophobicity of the second lyophobic material layer is less than a lyophobicity of the first lyophobic material layer.

According to one embodiment of this disclosure, a contact angle of the solutions for forming respective layers of the light-emitting diode on the second lyophobic material layer is in a range from 50 to 100 degrees.

According to one embodiment of this disclosure, the first lyophobic material layer has a thickness of 0.2-0.5 μm.

According to one embodiment of this disclosure, the second lyophobic material layer has a thickness of 0.2-2.0 μm.

According to one embodiment of this disclosure, the lyophilic material layer has a thickness of 0.05-0.5 μm.

According to another embodiment of this disclosure, the method further comprises: before forming the lyophilic material layer, forming a third lyophobic material layer on the base substrate, and then forming the lyophilic material layer on the third lyophobic material layer, and wherein the third lyophobic material layer is repellent to the solutions for forming respective layers of the light-emitting diode; and a lyophobicity of the third lyophobic material layer is less than or equal to a lyophobicity of the second lyophobic material layer.

According to one embodiment of this disclosure, the solutions for forming respective layers of a light-emitting diode comprise a solution comprising an organic electroluminescent material.

In still another aspect, this disclosure provides a display substrate, comprising: a base substrate; and a pixel defining layer according to any one described above provided on the base substrate.

DESCRIPTION OF DRAWINGS

In order to illustrate the technical solutions in examples of this disclosure more clearly, the figures required for describing the examples will be simply introduced below. It is apparent that the figures described below are merely exemplary examples of this disclosure, and other figures may be further obtained by those of ordinary skill in the art according to these figures without exerting inventive work.

DESCRIPTION OF EMBODIMENTS

Figure 1:
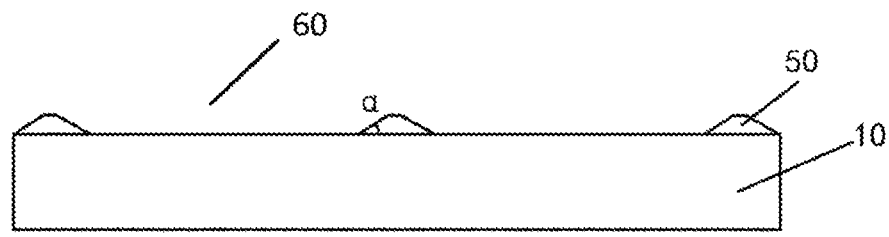
FIG. 1 is a structural schematic diagram exemplarily illustrating a pixel defining layer according to one embodiment of this disclosure.

The technical solutions in the examples of this disclosure will be described clearly and fully below in conjunction with specific embodiments of this disclosure. Obviously, the embodiments and/or examples described are merely a part of the embodiments and/or examples of this disclosure, rather than all of the embodiments and/or examples. Based on the embodiments and/or examples of this disclosure, all other embodiments and/or examples obtained by those of ordinary skill in the art without performing inventive work belong to the scope protected by this disclosure.

In this disclosure, the layer and the film may be interchangeably used, unless specifically indicated. In this disclosure, all characteristics of numeric values mean to be within an error range of measurement, for example within ±10%, within ±5%, or within ±1% of a defined numeric value. Terms "first", "second", "third", and the like are for the purpose of description only, and cannot be understood as indicating or suggesting relative importance or implying the number of technical features indicated. Thereby, a characteristic defined by "first", "second", "third", and the like may expressly or impliedly comprises one or more characteristics.

Compared to a liquid crystal display, an organic electroluminescent device display has the advantages of self-light emission, fast response, wide view angle, high brightness, brilliant colors, good lightness and thinness, and the like. There are mainly two methods for producing a light-emitting layer and an auxiliary layer (for example, a hole injection layer, a hole transport layer, an electron injection layer, an electron transport layer, and the like) thereof in an organic electroluminescent device, which are vacuum deposition and solution process. The vacuum deposition is suitable for film forming of an organic micromolecular material and has the advantages of good uniformity of film forming and being a relatively mature technique. However, with respect to a film forming apparatus, the investment is large, the utilization rate of materials is low, and the alignment accuracy is low when used in large-size products. The solution process comprises methods such as spin coating, ink-jet printing, nozzle coating, and the like, and is suitable for film forming of polymeric materials and soluble micromolecules. It has low apparatus cost and has prominent advantages in large-scale and large-size production, particularly for an ink-jet printing technique. A process for producing an organic material layer by ink-jet printing comprises an ink-jet printing process and a film forming process. In an ink-jet printing process, an ink is printed to the interior of an opening formed by a pixel defining layer. The printing precision of an apparatus will influence whether the ink will deviate from the center of a pixel. In a film forming process, an ink is allowed to form a thin film with a uniform thickness in an opening formed by a pixel defining layer, by controlling pressure, temperature, time, and the like of solvent volatilization. Due to the limitation by the printing precision of an apparatus, ink droplets may be allowed to deviate from the center of a pixel and printed by the printing apparatus, which will lead to overflow of ink to an adjacent pixel so as to influence the display quality of the display substrate. Therefore, it is desired to provide a pixel defining layer, which may improve the printing precision of ink. Therefore, it is further desired to provide a pixel defining layer, which may also improve the uniformity of film forming while the printing precision of ink may be improved.

In an aspect of this disclosure, there may be provided a pixel defining layer comprising a first lyophobic material layer located on a base substrate, wherein the first lyophobic material layer is repellent to solutions for forming respective layers of a light-emitting diode;

the pixel defining layer defines a plurality of openings in an array arrangement; and the first lyophobic material layer has a plurality of wall surfaces facing to each of the openings, wherein at least one wall surface of the plurality of wall surfaces has a slope angle larger than 0 degree and less than 90 degrees.

According to the above aspect of this disclosure, there may be provided a pixel defining layer, in which ink which is ink-jet printed on a wall surface by mistake may be allowed to slide into an opening defined by the pixel defining layer by providing a first lyophobic material layer on a base substrate and using a slope angle of at least one wall surface of a plurality of wall surfaces of the first lyophobic material layer and the lyophobicity of the first lyophobic material layer so as to improve the printing precision.

A slope angle of at least one wall surface of a plurality of wall surfaces of the first lyophobic material layer is selected to be larger than 0 degree and less than 90 degrees, and the material of the first lyophobic material layer is selected. By using the slope angle and the lyophobicity, ink droplets which is allowed to deviate from the center of a pixel and printed will slide into an opening defined by the pixel defining layer, so that it will not lead to overflow of ink to an adjacent pixel and the display quality of the display substrates is thus improved.

The pixel defining layer defines a plurality of openings, and the openings exhibit a matrix arrangement. The pixel defining layer, which defines each of the openings, has a plurality of wall surfaces facing to each of the openings. For example, in the case where the opening is a rectangular opening, it may have four wall surfaces. The slope angle of the first lyophobic material layer refers to an included angle between the wall surface of the first lyophobic material layer and the horizontal plane (the bottom surface of the first lyophobic material layer). The four wall surfaces of the pixel defining layer (or the first lyophobic material layer) may be symmetric or asymmetric. As described above, in order to improve the printing precision, at least one wall surface of a plurality of wall surfaces of the first lyophobic material layer has a slope angle larger than 0 degree and less than 90 degrees, which is an inclined surface. For example, the first lyophobic material layer having four wall surfaces facing to each of the openings is exemplified, in which one wall surface is an inclined surface while the other three wall surfaces are vertical surfaces, i.e., having a slope angle equal to 90 degrees; or two wall surfaces are inclined surfaces while the other two wall surfaces are vertical surfaces; or three wall surfaces are inclined surfaces while the rest one wall surface is a vertical surface; or four wall surfaces are all inclined surfaces. In the case where a plurality of wall surfaces are inclined surfaces, the included angle (that is, the slope angle) formed between each of the wall surfaces and the horizontal plane (the bottom surface of the first lyophobic material layer) may be the same or different. In order to further improve the printing precision, a plurality of wall surfaces are all inclined surfaces having a slope angle larger than 0 degree and less than 90 degrees. For example, the first lyophobic material layer has four wall surfaces facing to each of the openings, and slope angles of the four wall surfaces are equal.

The shape of the inclined surface may be an inclined surface exhibiting a step-type change, an arc-shaped inclined surface (for example, a circular-arc-shaped inclined surface), as long as the wall surface of the first lyophobic material layer remains to be in an inclined state so as to allow the ink deviating the pixel to slide into the opening defined by the pixel defining layer. In the case where the inclined surface is an arc-shaped inclined surface, the slope angle of the inclined surface at a certain point is an included angle between a tangent line of the arc shape at this point and the horizontal plane.

When the inclined surface is an inclined surface exhibiting a step-type change, the overall slope angle of the inclined surface is an arithmetic mean of from top to bottom slope angles which increase or decrease from top to bottom. For example, in the case where the inclined surface is composed of an upper inclined surface having a slope angle of 20 degrees and an lower inclined surface having a slope angle of 40 degrees, the slope angle thereof is 30 degrees. For example, in the case where the inclined surface is composed of a quarter of a circular arc, the slope angle thereof is 45 degrees.

FIG. 1 is a structural schematic diagram exemplarily illustrating a pixel defining layer according to one embodiment of this disclosure.

As shown in FIG. 1, a pixel defining layer according to another embodiment of this disclosure may be located on a base substrate 10. The pixel defining layer may comprise: a first lyophobic material layer 50.

The first lyophobic material layer 50 is repellent to solutions for forming respective layers of a light-emitting diode.

The solutions for forming respective layers of a light-emitting diode may comprise, for example, a solution for forming a hole transport layer, a solution for forming a hole injection layer, a solution for forming a light-emitting layer, a solution for forming an electron transport layer, or a solution for forming an electron injection layer.

In the description below, unless specifically indicated, the solutions may be, for example, a solution for forming a hole transport layer, a solution for forming a hole injection layer, a solution for forming a light-emitting layer, a solution for forming an electron transport layer, or a solution for forming an electron injection layer, for example, a solution for forming a light-emitting layer, i.e., a solution comprising an organic electroluminescent material.

The slope angle $\alpha$ of the first lyophobic material layer 50 is larger than 0 degree and less than 90 degrees. According to one embodiment of this disclosure, the slope angle $\alpha$ of the first lyophobic material layer 50 is less than or equal to 60 degrees. According to another embodiment of this disclosure, the slope angle $\alpha$ of the first lyophobic material layer 50 is less than or equal to 30 degrees. Even if the slope angle $\alpha$ is less than or equal to 60 degrees or even less than or equal to 30 degrees, the ink which is ink-jet printed on a wall surface by mistake may be allowed to slide into an opening 60 defined by the pixel defining layer by using the lyophobicity of the first lyophobic material layer 50.

The ink which is ink-jet printed on a wall surface by mistake may be allowed to slide into an opening 60 defined by the pixel defining layer by providing a first lyophobic material layer 50 on a base substrate 10 and using a slope angle α of the first lyophobic material layer 50 and the lyophobicity of the material of the first lyophobic material layer so as to improve the printing precision.

According to another embodiment of this disclosure, the plurality of wall surfaces of the first lyophobic material layer 50 may be planar or arc-shaped. In order to further improve the printing precision, the plurality of wall surfaces of the first lyophobic material layer 50 may be arc-shaped. By selecting masks, exposure conditions, and the like, the plurality of wall surfaces of the first lyophobic material layer 50 may be allowed to be planar or arc-shaped.

Figure 2:
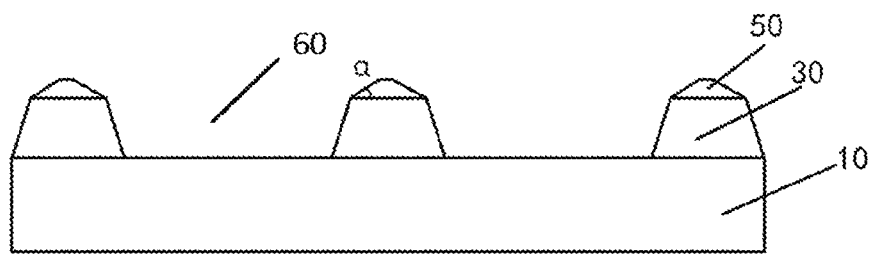
FIG. 2 is a structural schematic diagram exemplarily illustrating a pixel defining layer according to another embodiment of this disclosure.

FIG. 2 is a structural schematic diagram exemplarily illustrating a pixel defining layer according to another embodiment of this disclosure.

The pixel defining layer shown in FIG. 2 is the same as the pixel defining layer as shown in FIG. 1 except that The pixel defining layer as shown in FIG. 2 further comprises a lyophilic material layer 30 between the base substrate 10 and the first lyophobic material layer 50.

The lyophilic material layer 30 attracts the solutions for forming respective layers of a light-emitting diode (for example: a solution in which an organic electroluminescent material is dissolved (sometimes also referred to as an organic electroluminescent material solution)).

The section of the lyophilic material layer 30, which is between two adjacent openings 60, parallel to the center line of the two openings 60, and perpendicular to the base substrate, may be a positive trapezoid or an inverted trapezoid.

In addition to the improvement of the printing precision described above, the ink may be allowed to easily spread at the bottom of the opening 60 by using the lyophilicity of the lyophilic material layer 30 so as to improve the uniformity of film forming.

Figure 3:
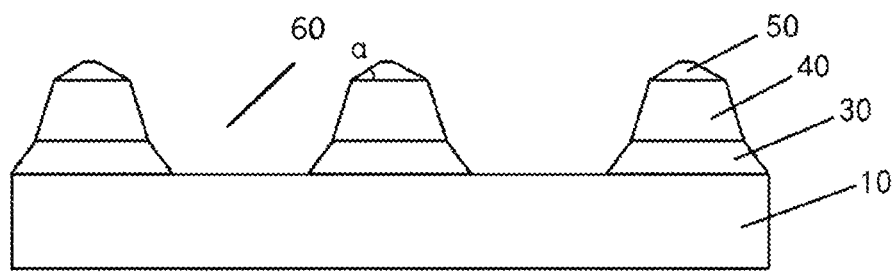
FIG. 3 is a structural schematic diagram exemplarily illustrating a pixel defining layer according to still another embodiment of this disclosure.

FIG. 3 is a structural schematic diagram exemplarily illustrating a pixel defining layer according to still another embodiment of this disclosure.

The pixel defining layer shown in FIG. 3 is the same as the pixel defining layer shown in FIG. 2 except that the pixel defining layer as shown in FIG. 3 further comprises a second lyophobic material layer 40 between the lyophilic material layer 30 and the first lyophobic material layer 50.

The second lyophobic material layer 40 is repellent to solutions for forming respective layers of a light-emitting diode (for example: an organic electroluminescent material solution).

The lyophobicity of the second lyophobic material layer 40 is less than the lyophobicity of the first lyophobic material layer 50.

The section of the second lyophobic material layer 40, which is between two adjacent openings 60, parallel to the center line of the two openings 60, and perpendicular to the base substrate, may be a positive trapezoid or an inverted trapezoid.

In addition to the improvement of the printing precision and the uniformity of film forming described above, the pixel defining layer as shown in FIG. 3 may control the climbing of ink in the opening 60 and improve the uniformity of film forming of ink by using the lyophobicity of the second lyophobic material layer 40, and may further control the climbing of ink in the opening 60 and thereby further improve the uniformity of film forming of ink by using the larger lyophobicity of the first lyophobic material layer 50.

Figure 4:
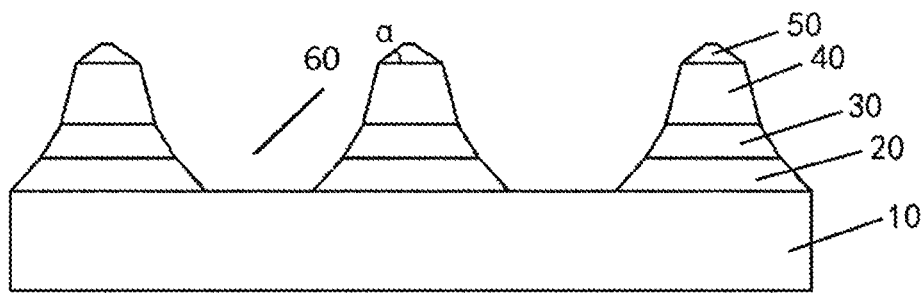
FIG. 4 is a structural schematic diagram exemplarily illustrating a pixel defining layer according to yet another embodiment of this disclosure.

FIG. 4 is a structural schematic diagram exemplarily illustrating a pixel defining layer according to yet another embodiment of this disclosure.

The pixel defining layer shown in FIG. 4 is the same as the pixel defining layer shown in FIG. 3 except that the pixel defining layer as shown in FIG. 4 further comprises a third lyophobic material layer 20 between the lyophilic material layer 30 and the base substrate 10.

The third lyophobic material layer 20 is repellent to solutions for forming respective layers of a light-emitting diode (for example: an organic electroluminescent material solution); and the lyophobicity of the third lyophobic material layer 20 is less than or equal to the lyophobicity of the second lyophobic material layer 40.

The section of the third lyophobic material layer 20, which is between two adjacent openings 60, parallel to the center line of the two openings 60, and perpendicular to the base substrate, may be a positive trapezoid or an inverted trapezoid.

In addition to the advantages of the pixel defining layer as shown in FIG. 3, the third lyophobic material layer 20 together with the lyophilic material layer 30 may control the thickness of the solutions for forming respective layers of a light-emitting diode climbing on the wall surface of the pixel defining layer by using the pixel defining layer as FIG. 4.

The third lyophobic material layer 20 has a repellent effect on the solutions for forming respective layers of a light-emitting diode, and the lyophilic material layer 30 has an attractive effect on the solutions for forming respective layers of a light-emitting diode. Upon ink-jet printing, the thickness of the solution climbing on the wall surface of the pixel defining layer will be relatively reduced under the coaction of the repellent effect and the attractive effect. Furthermore, due to the repellent effect of the second lyophobic material layer 40 on the solution, the height of the solution climbing on the wall surface of the pixel defining layer will be relatively reduced. For example, the height of the solution climbing on the wall surface of the pixel defining layer is 0.8 micrometers or even higher in the related art, but the height is less than 0.5 micrometers in an embodiment of this disclosure. In practical use, the reduction of the thickness and the height may be expressed by the amount of the solution used in ink-jet printing. For example, only 50 picoliters of a solution is theoretically needed when an organic material layer having a certain thickness is formed, and the amount of a solution practically needed is 100 picoliters due to climbing of the solution on a wall surface of a pixel when ink-jet printing is performed by using a pixel defining layer in the related art. However, the amount of a solution practically needed is 70 picoliters when ink-jet printing is performed by using a pixel defining layer in an embodiment of this disclosure.

As described above, the lyophobicity of the second lyophobic material layer 40 is less than the lyophobicity of the first lyophobic material layer 50. The lyophobicity of the third lyophobic material layer 20 is less than or equal to the lyophobicity of the second lyophobic material layer 40. The lyophobicities of the first lyophobic material layer 50, the second lyophobic material layer 40, and the third lyophobic material layer 20 may be represented by the contact angles of the solution or water thereon.

According to another embodiment of this disclosure, the contact angle of water on the first lyophobic material layer 50 is greater than 100 degrees. According to another embodiment of this disclosure, the contact angle of water on the second lyophobic material layer 40 is in a range from 50 to 100 degrees. According to another embodiment of this disclosure, the contact angle of water on the third lyophobic material layer 20 is in a range from 50 to 100 degrees.

The lyophobicity of the third lyophobic material layer and the lyophobicity of the second lyophobic material layer 40 may be the same or may be different. When the lyophobicity of the first lyophobic material layer 50 and the lyophobicity of the second lyophobic material layer 40 are different, the lyophobicity of the third lyophobic material layer 20 may be selected to be less than the lyophobicity of the second lyophobic material layer 40. In this way, the solutions for forming respective layers of a light-emitting diode (for example: an organic electroluminescent material solution) may easily enter a pixel area and forms a film in the pixel area upon ink-jet printing.

The lyophobic materials of the first lyophobic material layer 50, the second lyophobic material layer 40 and, the third lyophobic material layer 20 may be the same material or may be different materials. When the lyophobic materials of the first lyophobic material layer 50, the second lyophobic material layer 40 and, the third lyophobic material layer 20 are the same material, the adjustment of the lyophobicities of the first lyophobic material layer 50, the second lyophobic material layer 40 and, the third lyophobic material layer 20 may be achieved by controlling the numbers of lyophobic groups of the first lyophobic material layer 50, the second lyophobic material layer 40 and, the third lyophobic material layer 20, so that the lyophobicity of the second lyophobic material layer 40 is less than the lyophobicity of the first lyophobic material layer 50; and/or the lyophobicity of the third lyophobic material layer 20 is less than or equal to the lyophobicity of the second lyophobic material layer 40.

When the lyophobic materials of the first lyophobic material layer 50, the second lyophobic material layer 40 and, the third lyophobic material layer 20 are different materials, the adjustment of the lyophobicities of the first lyophobic material layer 50, the second lyophobic material layer 40 and, the third lyophobic material layer 20 may be achieved by controlling the lyophobic materials of the first lyophobic material layer 50, the second lyophobic material layer 40 and, the third lyophobic material layer 20, so that the lyophobicity of the second lyophobic material layer 40 is less than the lyophobicity of the first lyophobic material layer 50; and/or the lyophobicity of the third lyophobic material layer 20 is less than or equal to the lyophobicity of the second lyophobic material layer 40. Otherwise, the numbers of lyophobic groups in two different lyophobic materials may be controlled, so that the lyophobicity of the second lyophobic material layer 40 is less than the lyophobicity of the first lyophobic material layer 50; and/or the lyophobicity of the third lyophobic material layer 20 is less than or equal to the lyophobicity of the second lyophobic material layer 40.

According to another embodiment of this disclosure, the lyophobic material of the first lyophobic material layer 50 is selected from one or more of the following materials: fluorine-containing polyimide, fluorine-containing polymethyl methacrylate, or a composite of polyethyleneimine and stearic acid having a weight ratio of 1:1-1:2.

According to another embodiment of this disclosure, the lyophobic materials of the second lyophobic material layer 40 and the third lyophobic material layer 20 are selected from one or more of the following materials: fluorine-containing polyimide or fluorine-containing polymethyl methacrylate.

As described above, the lyophobic materials of the first lyophobic material layer 50, the second lyophobic material layer 40 and, the third lyophobic material layer 20 may be the same material or may be different materials. The lyophobic materials of the first lyophobic material layer 50, the second lyophobic material layer 40 and, the third lyophobic material layer 20 are selected such that the contact angle of one or more solutions on the first lyophobic material layer 50 is greater than 100 degrees, and the contact angle of the one or more solutions on the second lyophobic material layer 40 and the third lyophobic material layer 20 is in a range from 50 to 100 degrees.

When the first lyophobic material layer 50, the second lyophobic material layer 40 and, the third lyophobic material layer 20 are made of the same material, for example fluorine-containing polyimide, fluorine-containing polymethyl methacrylate, or a mixture of fluorine-containing polyimide and fluorine-containing polymethyl methacrylate, it may be allowed by means of different extents of fluorination that the lyophobicity of the second lyophobic material layer 40 is less than the lyophobicity of the first lyophobic material layer 50; and/or the lyophobicity of the third lyophobic material layer 20 is less than or equal to the lyophobicity of the second lyophobic material layer 40. The higher the extent of fluorination is, the stronger the lyophobicity is.

According to another embodiment of this disclosure, the lyophilic material of the lyophilic material layer 30 is selected from one or more of the following materials: a silicon oxide or a silicon nitride.

The value ranges of the thicknesses of the first lyophobic material layer 50, the second lyophobic material layer 40, the lyophilic material layer 30, and/or third lyophobic material layer 20 may also be set according to practical needs. For example, the thickness of the second lyophobic material layer 40 may be set to be greater than the thickness of the third lyophobic material layer 20. At the meanwhile, the thickness of the second lyophobic material layer 40 may also be greater than the thickness of the lyophilic material layer 30.

According to another embodiment of this disclosure, the first lyophobic material layer 50 has a thickness of 0.2-0.5 μm. According to another embodiment of this disclosure, the second lyophobic material layer 40 has a thickness of 0.2-2.0 μm. According to another embodiment of this disclosure, the lyophilic material layer 30 has a thickness of 0.05-0.5 μm. According to another embodiment of this disclosure, the third lyophobic material layer 20 has a thickness of 0.15-1.5 μm.

Figure 5:
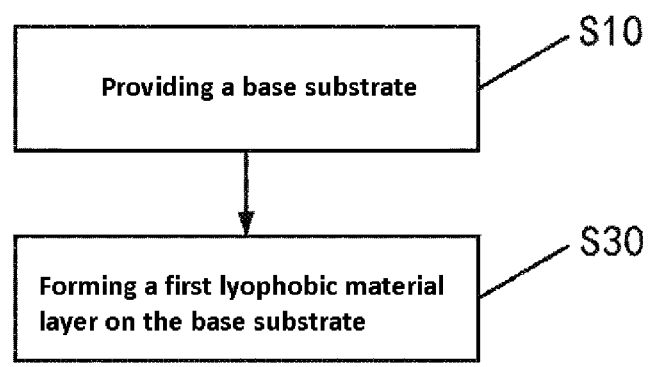
FIG. 5 is a schematic diagram exemplarily illustrating a method for producing a pixel defining layer according to one embodiment of this disclosure.

FIG. 5 is a schematic diagram exemplarily illustrating a method for producing a pixel defining layer according to one embodiment of this disclosure.

As shown in FIG. 5, the method for producing the pixel defining layer of any one described above may comprise the steps of:

S10: providing a base substrate; and

S30: forming a first lyophobic material layer on the base substrate.

The ink which is ink-jet printed on a wall surface by mistake may be allowed to slide into an opening defined by the pixel defining layer by forming a first lyophobic material layer on a base substrate and using a slope angle of at least one wall surface of a plurality of wall surfaces of the first lyophobic material layer and the lyophobicity of the first lyophobic material layer so as to improve the printing precision.

The method for producing the pixel defining layer of any one described above may further comprise:

Step S20: before forming the first lyophobic material layer, forming a lyophilic material layer on the base substrate, and then forming the first lyophobic material layer on the lyophilic material layer.

In addition to the improvement of the printing precision described above, the ink may be allowed to easily spread at the bottom of the opening by using the lyophilicity of the lyophilic material layer so as to improve the uniformity of film forming.

The method for producing the pixel defining layer of any one described above may further comprise:

Step S40: after forming the lyophilic material layer, forming a second lyophobic material layer on the lyophilic material layer, and then forming the first lyophobic material layer on the second lyophobic material layer.

In addition to the improvement of the printing precision described above, the climbing of ink in the opening 60 may be controlled and the uniformity of film forming of ink may be improved by using the lyophobicity of the second lyophobic material layer. Additionaly, the climbing of ink in the opening may further be controlled and thereby further improve the uniformity of film forming of ink by using the larger lyophobicity of the first lyophobic material layer.

The method for producing the pixel defining layer of any one described above may further comprise:

Step S50: before forming the lyophilic material layer, forming a third lyophobic material layer on the base substrate, and then forming a lyophilic material layer on the third lyophobic material layer.

The third lyophobic material layer together with the lyophilic material layer may control the thickness of the solution climbing on the wall surface of the pixel defining layer by forming the third lyophobic material layer.

In one embodiment of this disclosure, exemplarily, when the lyophilic material is any one of inorganic lyophilic materials such as silicon dioxide, silicon nitride, and the like, a method such as magnetron sputtering, thermal evaporation, or plasma enhanced chemical vapor deposition (simply referred to as PECVD) may be used to deposit a layer of a lyophilic material on the base substrate 10 to obtain a lyophilic material layer 30 in step S20. The lyophilic material layer 30 is then treated by a patterning process to obtain a lyophilic material layer 30 having a certain pattern. Here, the patterning process may comprise: photoresist coating, exposing, developing, etching, and photoresist peeling. When the first lyophobic material layer 50 is the lyophobic material described above, a layer of a lyophobic material may be coated on the lyophilic material layer 30 to obtain a lyophobic material layer in step S30. The lyophobic material layer is then subjected to treatments such as exposure, development, baking, and the like to obtain a patterned first lyophobic material layer 50. The process for forming the second lyophobic material layer 40 and/or the third lyophobic material layer 20 can be referred to the process of the first lyophobic material layer 50. Verbose words are omitted herein.

Furthermore, when the first lyophobic material layer 50 is exposed through a mask, by selecting the masks, exposure conditions, and the like, at least one wall surface of the plurality of wall surfaces of the first lyophobic material layer 50 may be allowed to have a slope angle larger than 0 degree and less than 90 degrees. Additionally, by selecting the masks, exposure conditions, and the like, the plurality of wall surfaces of the first lyophobic material layer 50 may be allowed to be planar or arc-shaped.

In practical use, a one-time patterning process may be performed once one layer is formed. For example, a one-time patterning process is performed once each of the layers in FIG. 1 to FIG. 4 is formed on the base substrate to form each of the pixel defining layers as shown in FIG. 1 to FIG. 4. Otherwise, after the entire lyophilic material layer 30 and the entire first lyophobic material layer 50 are formed, the two material layers may be treated by a one-time patterning process to form a pixel defining layer as shown in FIG. 2. Otherwise, after the entire lyophilic material layer 30, the entire second lyophobic material layer 40, and the entire first lyophobic material layer 50 are formed, the three material layers may be treated by a one-time patterning process to form a pixel defining layer as shown in FIG. 3. Otherwise, after the entire third lyophobic material layer 20, the entire lyophilic material layer 30, the entire second lyophobic material layer 40, and the entire first lyophobic material layer 50 are formed, the four material layers may be treated by a one-time patterning process to form a pixel defining layer as shown in FIG. 4. By treating this multi-layered material layer by a one-time patterning process, the production process may be simplified to some extent and the production cost may be reduced.

Also, when this multi-layered material layer is treated by a one-time patterning process, by selecting the masks, exposure conditions, and the like, at least one wall surface of the plurality of wall surfaces of the first lyophobic material layer 50 may be allowed to have a slope angle larger than 0 degree and less than 90 degrees. Additionally, by selecting the masks, exposure conditions, and the like, the plurality of wall surfaces of the first lyophobic material layer 50 may be allowed to be planar or arc-shaped.

It is to be indicated that the sequential order of the steps in the production method of the pixel defining layer provided in embodiments of this disclosure may be properly adjusted, and the steps may be accordingly added and deleted depending on cases. Within the technical scope disclosed by this disclosure, any person skilled in the art can easily conceive varied methods, which should be covered by the scope of the disclosure. Therefore, verbose words are omitted.

According to an example of this disclosure, the material of the lyophilic material layer 30 is $SiO_2$, which is formed by PECVD film forming, spin coating of a photoresist, and patterning achieved through processes of exposure, development, dry etching, and peeling. The lyophilic material layer 30 obtained has a thickness of 200 nm.

The material of the second lyophobic material layer 40 is fluorine-containing polyimide, and the patterning of the second lyophobic material layer 40 is achieved by spin coating, film forming, exposure, and development. The second lyophobic material layer 40 obtained has a thickness of 1.0 μm, and the contact angle on water is 80°.

The material of the first lyophobic material layer 50 is a composite of polyethyleneimine and stearic acid having a weight ratio of 1:1.5, and the patterning of the first lyophobic material layer 50 is achieved by spin coating, film forming, exposure, and development. The first lyophobic material layer 50 obtained has a thickness of 0.3 μm and a slope angle α of 25°, and the contact angle on water is 150°.

Figure 6:
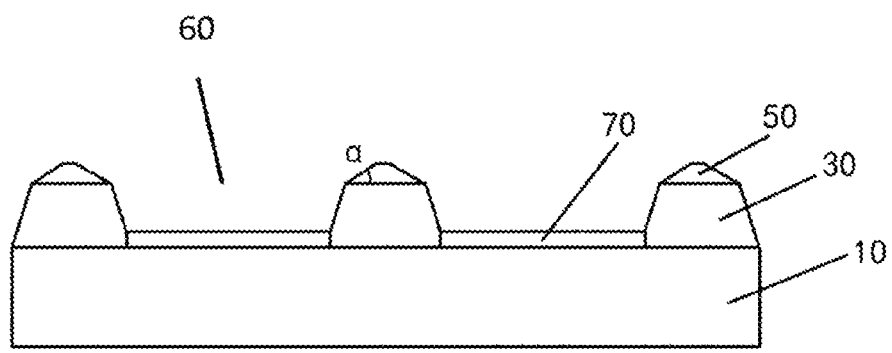
FIG. 6 is a structural schematic diagram exemplarily illustrating a display substrate according to one embodiment of this disclosure.

FIG. 6 is a structural schematic diagram exemplarily illustrating a display substrate according to one embodiment of this disclosure.

As shown in FIG. 6, the display substrate may comprise a base substrate 10, a pixel defining layer on the base substrate 10, and a pixel electrode 70 in an opening 60 of the pixel defining layer. The pixel electrode 70 may be a transparent anode or a transparent cathode. The pixel electrode 70 may be produced from indium tin oxide. In the embodiment as shown in FIG. 6, the pixel defining layer exemplified is the pixel defining layer as shown in FIG. 2. However, the pixel defining layer may be any one of the pixel defining layers as shown in FIG. 1 to FIG. 4. The method for forming the display substrate may comprise: providing a base substrate 10, forming a pixel electrode 70 on the base substrate 10 by sputtering and patterning, and forming a pixel defining layer on the base substrate 10 formed with the pixel electrode 70.

In practical use, the display substrate may further comprise at least: an anode provided between the base substrate and the pixel defining layer and a cathode provided on pixel defining layer, or a cathode provided between the base substrate and the pixel defining layer and an anode provided on pixel defining layer. This display substrate may be used to constitute an OLED display panel. This OLED display panel may comprise: the display substrate provided in any one of this disclosure and a cover plate capping the cathode of the display substrate.

An aspect of this disclosure further provides a display apparatus, which may comprise the OLED display panel described above, and this display apparatus may be any product or member having the function of display, such as a liquid crystal panel, an electronic paper, a cell phone, a tablet computer, a television, a display, a laptop, a digital photo frame, a navigator, etc.

In summary, the ink which is ink-jet printed on a wall surface by mistake may be allowed to slide into an opening defined by the pixel defining layer by providing a first lyophobic material layer on a base substrate and using a slope angle of at least one wall surface of a plurality of wall surfaces of the first lyophobic material layer and the lyophobicity of the first lyophobic material layer so as to improve the printing precision.

Obviously, various modifications and variations may be made to the examples of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. A pixel defining layer, comprising
a base substrate,
a lyophilic material layer,
a first lyophobic material layer, and
a second lyophobic material layer,
wherein
the lyophilic material layer is located between the first lyophobic material layer and the base substrate, and the second lyophobic material layer is located between the lyophilic material layer and the first lyophobic material layer;
the first lyophobic material layer is repellent to solutions for forming respective layers of a light-emitting diode, the lyophilic material layer attracts the solutions for forming respective layers of the light-emitting diode, and the second lyophobic material layer is repellent to the solutions for forming respective layers of the light-emitting diode;
the pixel defining layer defines a plurality of openings in an array arrangement;
the first lyophobic material layer has a plurality of wall surfaces facing to each of the openings, wherein at least one wall surface of the plurality of wall surfaces has a slope angle larger than 0 degree and less than 90 degrees; and
a lyophobicity of the second lyophobic material layer is less than a lyophobicity of the first lyophobic material layer.

2. The pixel defining layer according to claim 1, wherein at least one wall surface of the plurality of wall surfaces has a slope angle less than or equal to 60 degrees.

3. The pixel defining layer according to claim 1, wherein the first lyophobic material layer has four wall surfaces facing to each of the openings, and slope angles of the four wall surfaces are equal.

4. The pixel defining layer according to claim 1, wherein the plurality of wall surfaces are planar or arc-shaped.

5. The pixel defining layer according to claim 1, wherein the first lyophobic material layer has a thickness of 0.2-0.5 μm;
the second lyophobic material layer has a thickness of 0.2-2.0 μm; and
the lyophilic material layer has a thickness of 0.05-0.5 μm.

6. The pixel defining layer according to claim 1, further comprising a third lyophobic material layer, wherein
the third lyophobic material layer is located on a side of the lyophilic material layer away from the first lyophobic material layer; and
the third lyophobic material layer is repellent to the solutions for forming respective layers of the light-emitting diode, and a lyophobicity of the third lyophobic material layer is less than or equal to a lyophobicity of the second lyophobic material layer.

7. A method for producing a pixel defining layer, in turn, comprising steps of:
providing a base substrate;
forming a lyophilic material layer on the base substrate, wherein the lyophilic material layer attracts solutions for forming respective layers of a light-emitting diode;
forming a second lyophobic material layer on the lyophilic material layer, wherein the second lyophobic material layer is repellent to the solutions for forming respective layers of the light-emitting diode; and
forming a first lyophobic material layer on the second lyophobic material layer, wherein the first lyophobic material layer is repellent to the solutions for forming respective layers of the light-emitting diode;
wherein
a lyophobicity of the second lyophobic material layer is less than a lyophobicity of the first lyophobic material layer; and
the pixel defining layer defines a plurality of openings in an array arrangement; the first lyophobic material layer has a plurality of wall surfaces facing to each of the openings, wherein at least one wall surface of the plurality of wall surfaces has a slope angle larger than 0 degree and less than 90 degrees.

8. The method according to claim 7, wherein at least one wall surface of the plurality of wall surfaces has a slope angle less than or equal to 60 degrees.

9. The method according to claim 7, wherein the first lyophobic material layer has four wall surfaces facing to each of the openings, and slope angles of the four wall surfaces are equal.

10. The method according to claim 7, wherein the plurality of wall surfaces are planar or arc-shaped.

11. The method according to claim 7, wherein a contact angle of the solutions for forming respective layers of the light-emitting diode on the first lyophobic material layer is greater than 100 degrees.

12. The method according to claim 7, wherein a contact angle of the solutions for forming respective layers of the light-emitting diode on the second lyophobic material layer is in a range from 50 to 100 degrees.

13. The method according to claim 7, wherein the first lyophobic material layer has a thickness of 0.2-0.5 µm;
the second lyophobic material layer has a thickness of 0.2-2.0 µm; and
the lyophilic material layer has a thickness of 0.05-0.5 µm.

14. The method according to claim 7, further comprising: before forming the lyophilic material layer, forming a third lyophobic material layer on the base substrate, and then forming the lyophilic material layer on the third lyophobic material layer, and wherein the third lyophobic material layer is repellent to the solutions for forming respective layers of the light-emitting diode; and a lyophobicity of the third lyophobic material layer is less than or equal to a lyophobicity of the second lyophobic material layer.

15. The method according to claim 7, wherein the solutions for forming respective layers of the light-emitting diode comprise a solution comprising an organic electroluminescent material.

16. A display substrate, comprising:
a base substrate; and
a pixel defining layer according to claim 1 provided on the base substrate.

\* \* \* \* \*